United States Patent
Shuto

(10) Patent No.: US 7,535,745 B2
(45) Date of Patent: May 19, 2009

(54) FERROELECTRIC MEMORY DEVICE AND METHOD OF MANUFACTURING THE SAME

(75) Inventor: Susumu Shuto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 33 days.

(21) Appl. No.: 11/454,933

(22) Filed: Jun. 19, 2006

(65) Prior Publication Data
US 2006/0284224 A1    Dec. 21, 2006

(30) Foreign Application Priority Data
Jun. 20, 2005    (JP) .............................. 2005-179172

(51) Int. Cl.
*G11C 11/22*    (2006.01)
(52) U.S. Cl. .............................. 365/145; 257/E27.104; 257/E29.164; 257/E21.208; 257/E21.663; 257/E21.664; 257/303; 257/295; 257/296; 365/49.13; 365/65; 365/148; 438/3; 438/239; 438/253; 438/396
(58) Field of Classification Search ........................ None
See application file for complete search history.

(56) References Cited

U.S. PATENT DOCUMENTS 6,074,910 A * 6/2000 Lin ............................ 438/253
6,504,198 B2 * 1/2003 Morimoto .................... 257/295
2002/0155659 A1 * 10/2002 Chen et al. ................... 438/240
2003/0205738 A1 * 11/2003 Kanaya et al. ............... 257/200

FOREIGN PATENT DOCUMENTS

JP    2002-289797    10/2002

OTHER PUBLICATIONS

N. Nagel, et al., "New Highly Scalable 3 Dimensional Chain FeRAM Cell with Vertical Capacitor", 2004 Symposium on VLSI Technology Proceedings, Digest of Technical Papers, pp. 146-147.

* cited by examiner

*Primary Examiner*—Sue Purvis
*Assistant Examiner*—Fei Fei Yeung Lopez
(74) *Attorney, Agent, or Firm*—Oblon, Spivak, McClelland, Maier & Neustadt, P.C.

(57) ABSTRACT

A ferroelectric memory device, which includes a vertical ferroelectric capacitor having an electrode distance smaller than a minimum feature size of lithography technology being used and suitable for the miniaturization, and a method of manufacturing the same are disclosed. According to one aspect of the present invention, it is provided a ferroelectric memory device comprising an MIS transistor formed on a substrate, and a ferroelectric capacitor formed on an interlevel insulator above the MIS transistor, wherein a pair of electrodes of the ferroelectric capacitor are disposed in a channel length direction of the MIS transistor to face each other putting a ferroelectric film in-between, and wherein a distance between the electrodes of the ferroelectric capacitor is smaller than a gate length of the MIS transistor.

5 Claims, 14 Drawing Sheets

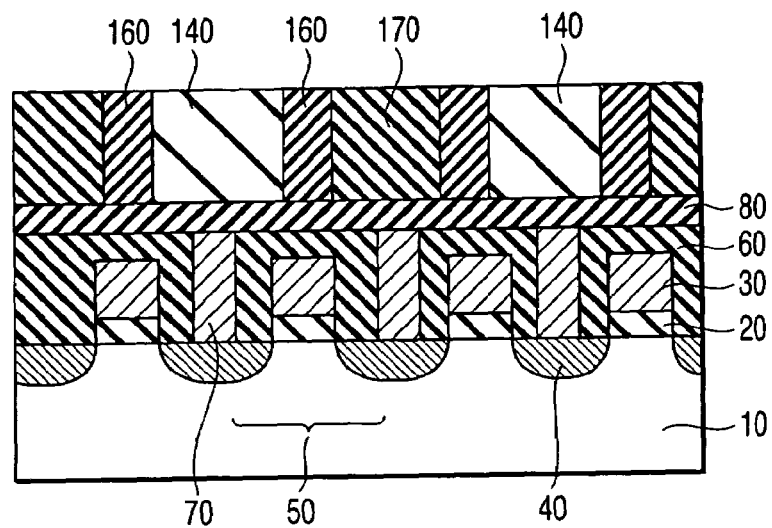
F I G. 3 E
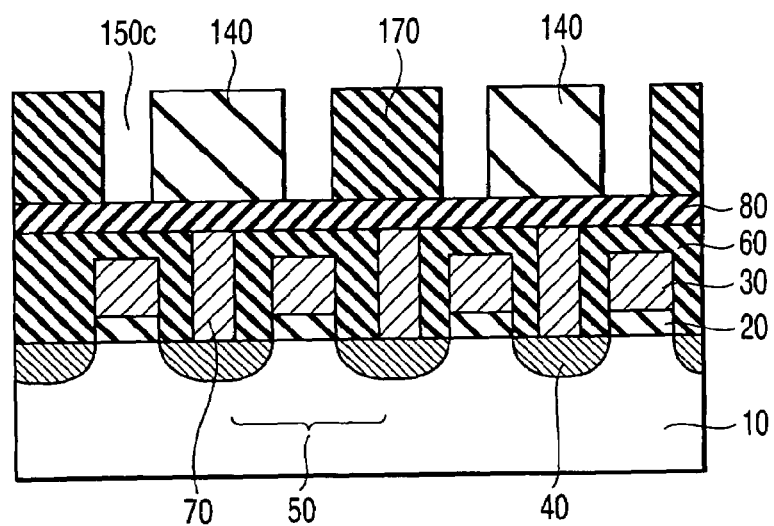
F I G. 3 F

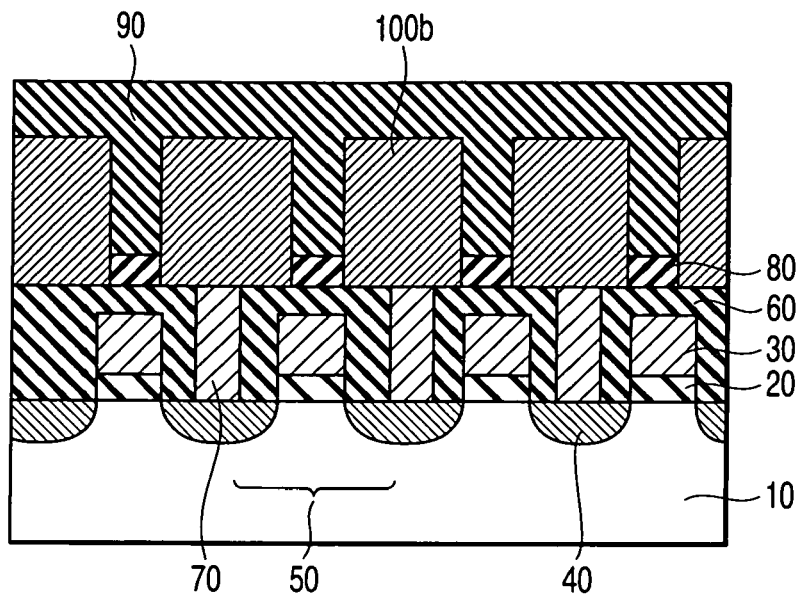
F I G. 5 E
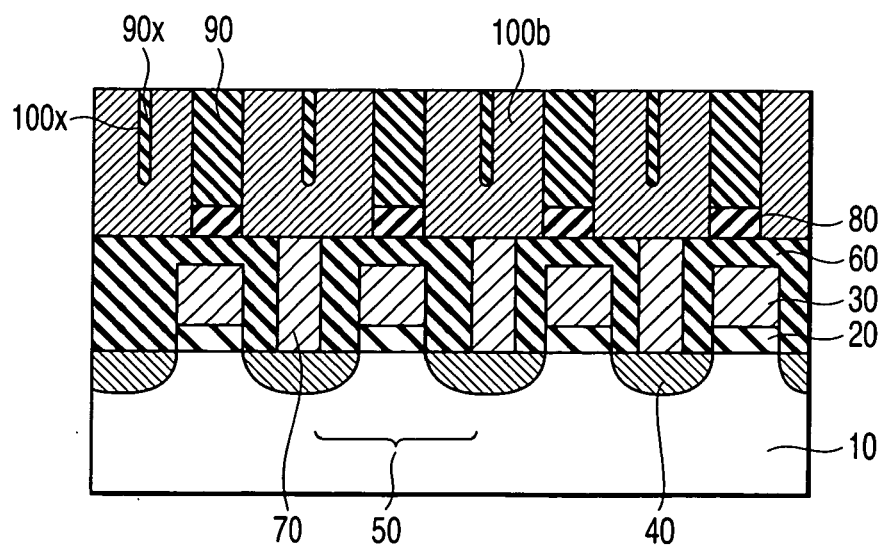
F I G. 6

FERROELECTRIC MEMORY DEVICE AND METHOD OF MANUFACTURING THE SAME

CROSS-REFERENCE TO RELATED APPLICATIONS

This application is based upon and claims the benefit of priority from prior Japanese Patent Application No. 2005-179172, filed Jun. 20, 2005, the entire contents of which are incorporated herein by reference.

BACKGROUND OF THE INVENTION

1. Field of the Invention

The present invention relates to a ferroelectric memory device and a method of manufacturing the same.

2. Description of the Related Art

A ferroelectric memory device comprising a ferroelectric capacitor is widely used to various applications since the ferroelectric memory device is non-volatile and is able to rewrite content being stored. To further extend the applications, it is essential to miniaturize a cell size so that a memory capacity increases.

For the purpose of miniaturizing a cell size, there is known a ferroelectric memory device having a so-called vertical ferroelectric capacitor in which a pair of capacitor electrodes are disposed in vertical facing each other and disposed in a channel length direction of a transistor putting a ferroelectric film in-between (refer to, for example, Jpn. Pat. Appln. KOKAI Publication No. 2002-289797).

In a conventional horizontal capacitor in which electrodes of the capacitor are disposed in parallel with a silicon substrate, a capacitor size is miniaturized as a cell size is shrunk. However, even though a cell is miniaturized, a parasitic capacitance of a bit line is not so reduced as the reduction ratio of the capacitor. Accordingly, as the cell is more miniaturized, the parasitic capacitance of the bit line is increased more in comparison with a capacitance of the ferroelectric capacitor.

In a vertical capacitor as the subject of the present invention, an area of the capacitor is determined by height of the capacitor. Accordingly, even if the lateral size of a device is miniaturized by shrinking its cell size, a capacitance can be maintained to be balanced with a parasitic capacitance of a bit line.

A voltage necessary to reverse a polarizing direction of a ferroelectric film is determined depending on a ferroelectric material and its thickness. Accordingly, to reduce the voltage necessary to reverse the polarizing direction of the vertical capacitor, a thickness of the ferroelectric film must be reduced. In a conventional processing technology, since a distance between electrodes of the ferroelectric film is determined by capability of a lithography technology being used, the limit of miniaturization is determined by resolution limit of the lithography. Accordingly, it is not easy to further reduce the distance between the electrodes of the vertical capacitor, and thus it is also not easy to reduce the voltage for reversing the polarizing direction of the ferroelectric film of the ferroelectric capacitor.

BRIEF SUMMARY OF THE INVENTION

According to one aspect of the present invention, it is provided a ferroelectric memory device comprising: an MIS transistor formed on a substrate; and a ferroelectric capacitor formed on an interlevel insulator above the MIS transistor, wherein a pair of electrodes of the ferroelectric capacitor are disposed in a channel length direction of the MIS transistor to face each other putting a ferroelectric film in-between, and wherein a distance between the electrodes of the ferroelectric capacitor is smaller than a gate length of the MIS transistor.

According to another aspect of the present invention, it is provided a method of manufacturing a ferroelectric memory device comprising: forming an MIS transistor on a semiconductor substrate; forming an insulator over the MIS transistor; forming a sacrificial film on the insulator; patterning the sacrificial film to form a groove therein; forming a ferroelectric film on side surfaces of the patterned sacrificial film; removing the sacrificial film; and forming electrodes on both side surfaces of the ferroelectric film.

According to another aspect of the present invention, it is provided a method of manufacturing a ferroelectric memory device comprising: forming an MIS transistor on a semiconductor substrate; forming an insulator over the MIS transistor; forming a first sacrificial film on the insulator; patterning the first sacrificial film to form a first groove therein; forming a second sacrificial film on side surfaces of the patterned first sacrificial film; filling the first groove remaining between the second sacrificial films with a third sacrificial film; removing the second sacrificial film to form a second groove; filling the second groove with a ferroelectric film; removing the first and third sacrificial films to form third grooves; and forming electrodes by filling the third grooves with conductive material.

According to another aspect of the present invention, it is provided a method of manufacturing a ferroelectric memory device comprising: forming an MIS transistor on a semiconductor substrate; forming an insulator over the MIS transistor; forming a first sacrificial film on the insulator; patterning the first sacrificial film to form a first groove therein; forming a second sacrificial film on side surfaces of the patterned first sacrificial film; removing the first sacrificial film to form second grooves; forming electrodes by filling the second grooves with conductive material; removing the second sacrificial film to form a third groove; and forming a ferroelectric film to fill the third groove.

BRIEF DESCRIPTION OF THE SEVERAL VIEWS OF THE DRAWING

FIGS. 5A to 5E are process sectional views shown to explain an example of manufacturing processes of the ferroelectric memory device according to the third embodiment;

FIG. 6 is a sectional view shown to explain an example of a modification of the ferroelectric memory device according to the third embodiment;

DETAILED DESCRIPTION OF THE INVENTION

Figure 1:
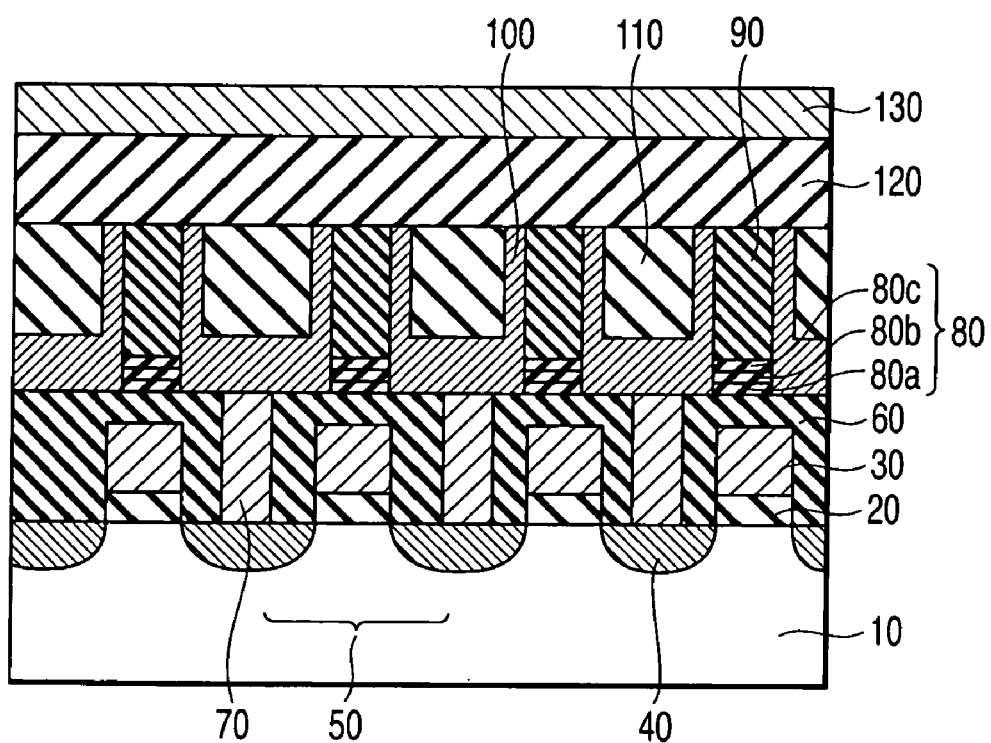
FIG. 1 is a sectional view shown to explain an example of a structure of a ferroelectric memory device according to a first embodiment of the present invention.

The embodiments of the present invention will be described with reference to the accompanying drawings. Throughout the drawings, corresponding portions are denoted by corresponding reference numerals. Each of the following embodiments is illustrated as one example, and therefore the present invention can be variously modified and implemented without departing from the spirits of the present invention.

The present invention provides a ferroelectric memory device comprising a vertical ferroelectric capacitor, in which an electrode distance of the vertical ferroelectric capacitor is smaller than a minimum feature size of a lithography technology being used, and which is suitable for miniaturization, and a method of manufacturing the same. The electrode distance is determined by a film thickness so that it does not depend on resolution limit of the lithography technology.

The embodiments of the present invention will be explained below.

First Embodiment

First embodiment of the present invention provides a ferroelectric memory device comprising a vertical ferroelectric capacitor having an electrode distance smaller than a minimum feature size of a lithography technology being used, and which is suitable for miniaturization, and a method of manufacturing the same. The vertical capacitor includes a pair of electrodes disposed in a channel length direction of a MIS transistor to face each other and a ferroelectric film put in-between. The electrode distance is determined by thickness of the ferroelectric film deposited on a side surface of a patterned sacrificial film.

The first embodiment will be explained using a chain type ferroelectric memory device as an example. FIG. 1 is a sectional view in a chain direction of the ferroelectric memory device showing an example of a structure according to the embodiment. The embodiment includes a transistor 50, for example, an MIS transistor, disposed on a semiconductor substrate 10 and a vertical ferroelectric capacitor disposed above the transistor 50. The transistor 50 and the ferroelectric capacitor are electrically connected in parallel to each other and constitute a single memory cell. A plurality of memory cells are connected in series to each other and constitute a chain type ferroelectric memory device.

A pair of electrodes 100 of the ferroelectric capacitor are disposed in a channel length direction of the transistor 50 facing each other and put a ferroelectric film 90 in-between. An electrode distance is smaller than a gate length of the transistor 50. The gate length is patterned to a minimum feature size of a lithography technology being used.

The chain type ferroelectric memory device of the embodiment will be explained below in detail.

The transistor 50 is disposed on the semiconductor substrate 10, for example, a silicon substrate, and includes a gate insulator 20, a gate electrode 30, and diffusion layers 40. The gate length of the transistor 50 is patterned to a minimum feature size of the lithography technology being used. A silicon oxide film ($SiO_2$ film) or a silicon oxinitride film (SiON film), for example, can be used as the gate insulator 20. Polycrystalline silicon doped with dopant or the like, for example, can be used as the gate electrode 30. A first interlevel insulator 60 is formed over the gate electrode 30. A $SiO_2$ film formed by, for example, chemical vapor deposition (CVD) can be used as the first interlevel insulator 60.

A contact plug 70 constituted of a conductive material, such as titanium (Ti), tungsten (W) or the like, is disposed in the first interlevel insulator 60 on the diffusion layer 40 and the upper portion of the contact plug 70 is connected to the electrode 100 of the ferroelectric capacitor. Platinum (Pt), ruthenium oxide ($RuO_2$), iridium oxide ($IrO_2$), titanium (Ti), titanium nitride (TiN), or the like, for example, can be used as the material of the electrode 100.

The vertical ferroelectric capacitor is disposed above the transistor 50 on the first interlevel insulator 60. The ferroelectric capacitor includes a pair of vertical electrodes 100 disposed in a channel length direction of the transistor 50 facing each other and a ferroelectric film 90 sandwiched between the electrodes 100. As the ferroelectric film 90, it is preferable to use an insulator having a perovskite structure, for example, PZT ($Pb(Zr_xTi_{1-x}O_3)$). In addition to PZT, SBT ($SrBi_2Ta_2O_9$) or BLT (($BiLa)_4Ti_3O_{12}$), or ferroelectric materials containing the above materials and/or to which at least one element such as strontium (Sr), barium (Ba), calcium (Ca), lanthanum (La), niobium (Nb), tungsten (W), magnesium (Mg), cobalt (Co), iron (Fe), nickel (Ni), manganese (Mn), or the like is added, or the like can be used. The ferroelectric film 90 is sandwiched between the pair of electrodes 100 and electrically connected to the electrodes 100. The electrode distance of the ferroelectric capacitor is smaller than the gate length of the transistor 50. In other words, it is smaller than the minimum feature size of the lithography technology being used.

One ferroelectric capacitor and one transistor 50 are electrically connected in parallel to constitute a single memory cell.

A third interlevel insulator 110, which is composed of, for example, $SiO_2$, BPSG, BSG, PGS or a fluorine added film thereof insulates between adjacent memory cells.

A plurality of memory cells connected in series to each other constitute a chain structure. Eight memory cells, for example, can be connected in series, but the number of memory cells to be connected in series is not limited to eight and may be 16, 32 or more, or less than eight. Further, a diffusion layer at one end of the chain is connected to a bit line 130 through a block select transistor (not shown) for determining whether or not the chain is to be selected. The opposite end of the chain is connected to a plate line (not shown), and further the gate electrode 30 connects respective memory cells in a direction vertical to the paper surface to each other and serves as a word line.

An example of a method of manufacturing the ferroelectric memory device of the embodiment will be explained using process sectional views in the chain direction of the ferroelectric memory device shown in FIGS. 2A to 2F.

(1) First, a gate insulator 20 and a gate electrode film 30 are deposited on a semiconductor substrate 10, for example, a silicon substrate. The electrode film 30 is patterned by lithography and etching, for example, reactive ion etching (RIE), and thus a gate electrode 30 is formed.

Next, diffusion layers 40 are formed by doping a dopant, for example, arsenic (As) into the semiconductor substrate 10 by, for example, ion implantation using the gate electrode 30 as a mask.

Next, a first interlevel insulator 60 is deposited to cover the gate electrode 30 to insulate the gate electrode 30, and surface of the first interlevel insulator 60 is planarized by chemical mechanical polishing (CMP). The transistor 50 including the gate insulator 20, the gate electrode 30, and the diffusion layer 40 is formed through the above processes.

(2) Next, a contact plug 70 connected to the diffusion layer 40 is being formed. As a method of forming the contact plug 70, a contact hole, which reaches the diffusion layer 40 in the semiconductor substrate 10, is formed in the first interlevel insulator 60 by lithography and etching.

Thereafter, a high melting point metal, for example, tungsten (W) or the like, is deposited by CVD to fill the inside of the contact hole, and the surface thereof is planarized by, for example, CMP. Titanium (Ti), titanium nitride (TiN), or the like may be deposited as a contact metal (not shown) to prevent oxidation of the surface of the tungsten in the contact hole. Further, it is preferable to deposit a silicon nitride film ($Si_3N_4$ film) (not shown) or the like on the upper portion of the contact plug to prevent oxidation of the upper portion of the contact plug when it is subjected to a heat treatment in an oxidizing atmosphere in a later process.

Figure 2A:
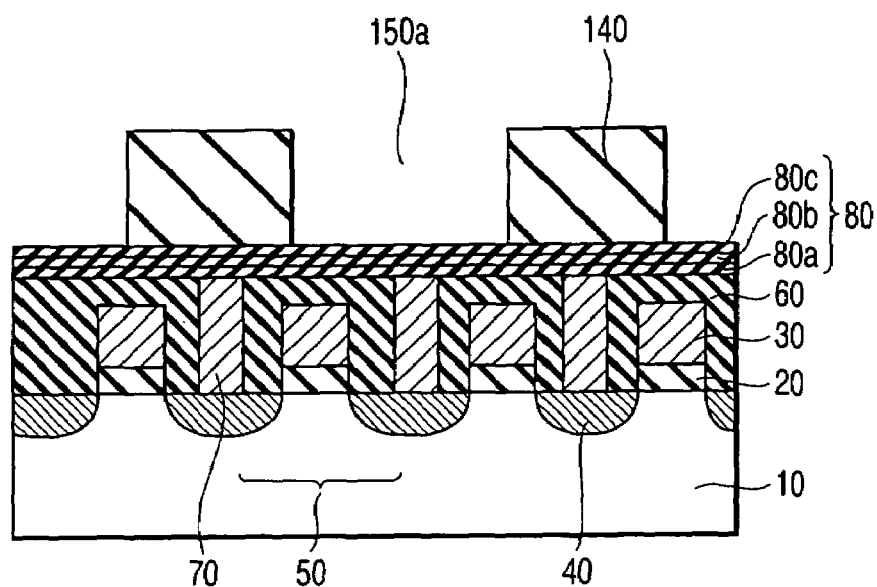
FIGS. 2A to 2F are process sectional views shown to explain an example of manufacturing process of the ferroelectric memory device according to the first embodiment.

Next, a second interlevel insulator 80 is deposited on an entire surface of the first interlevel insulator 60. As shown in FIG. 2A, a laminated film of a silicon nitride film 80a and a silicon oxide film 80b can be used as the second interlevel insulator 80. Alternatively, any one of the silicon nitride film or the silicon oxide film may be used, or a silicon oxinitride film (SiON film) may be used. In the laminate film of the silicon nitride film 80a and the silicon oxide film 80b, if each film has a film thickness of, for example, about 150 nm, an effect of preventing the transistor from oxidation in an anneal process carried out later in an oxidizing atmosphere can be expected.

Further, an alumina film ($Al_2O_3$ film) 80c having a thickness of, for example, about 20 nm is deposited as a part of the second interlevel insulator 80. The alumina film 80c has an effect of improving crystallinity of a ferroelectric film when it is crystallized, the ferroelectric film being deposited on the alumina film 80c in a later process, and also has an effect of preventing the ferroelectric film from reacting with the silicon oxide film used as the sacrificial film. The alumina film can be deposited using atomic layer CVD (ALCVD) or sputtering.

(3) Next, the vertical ferroelectric capacitor is being formed above the transistor 50. First, a sacrificial film 140 is formed on a planarized surface of the second interlevel insulator 80. Since the sacrificial film 140 is removed in a later process, it does not remain in the ferroelectric memory device when completed. A silicon oxide film having a thickness of, for example, about 200 nm can be used as the sacrificial film 140. The thickness of the sacrificial film 140 determines a height of the vertical ferroelectric capacitor.

Next, the sacrificial film 140 is patterned by lithography and etching, for example, by RIE, to form a groove 150a therein, as shown in FIG. 2A. In the patterning of the sacrificial film 140 by RIE, it is preferable to have a film that acts as an RIE etching stopper under the sacrificial film 140. In the embodiment, since the second interlevel insulator 80 under the sacrificial film 140 includes the alumina film 80c, the second interlevel insulator 80 can be used as the etching stopper. Further, if the alumina film is not included, the silicon nitride film 80a in the second interlevel insulator 80 can be used as the etching stopper. Further, the groove 150a formed by patterning the sacrificial film 140 is aligned so that each side surface of the sacrificial film 140 is located above the transistor 50 and between two adjacent contact plugs 70. That is, it is preferable to form the groove 150a such that each edge of the sacrificial film 140 is located just above the gate electrode 30.

Figure 2B:
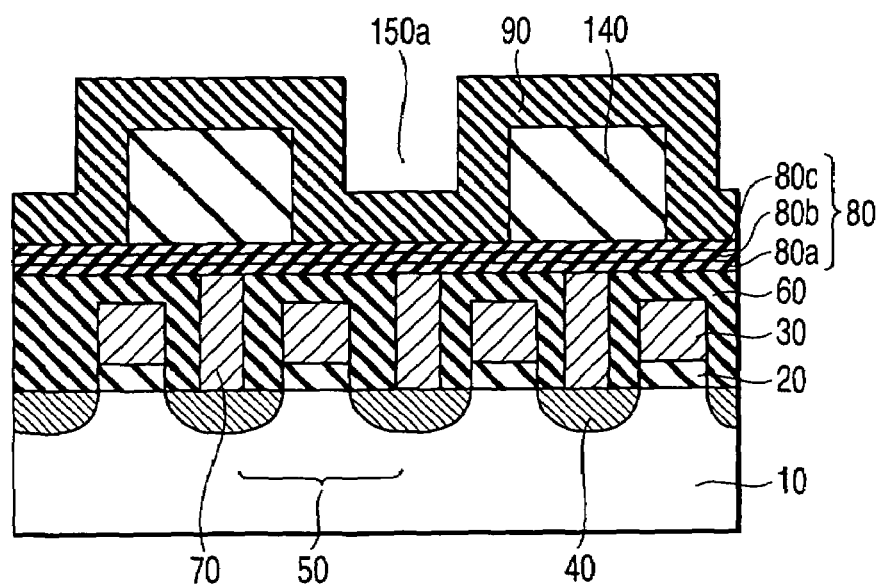
Figure 2C:
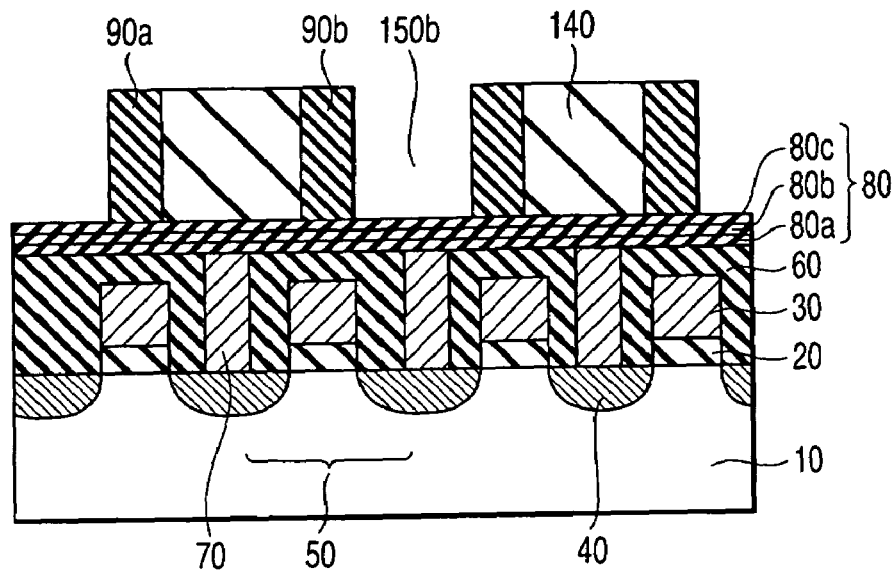

(4) Next, as shown in FIG. 2B, the ferroelectric film 90 is deposited to cover the upper surface of the sacrificial film 140 and entire inner surfaces of the groove 150a. A thickness of the ferroelectric film 90 in the horizontal direction deposited on the side surfaces of the sacrificial film 140 corresponds to a thickness of the ferroelectric film of the ferroelectric capacitor to be formed there, that is, to an electrode distance thereof.

Accordingly, the thickness of the ferroelectric film 90 is determined so that a necessary electric field can be achieved based on requirement of capacitance of the capacitor and a drive voltage. In the film deposition, metal organic CVD (MOCVD), for example, can be used to improve coverage of the ferroelectric film 90 on the side surfaces of the sacrificial film 140. Although it is preferable to deposit the ferroelectric film 90 on the side surfaces of the sacrificial film 140 in a uniform thickness, it may be deposited in a non-uniform thickness in the upper portion and the lower portion of the side surfaces. Further, it may be allowed to deposit the ferroelectric film 90 thick in the corner portions of the sacrificial film 140.

Next, the ferroelectric film 90 deposited on a horizontal surface is removed by etching back the entire surface of the ferroelectric film 90 using RIE, and thus a groove 150b is formed. Accordingly, the ferroelectric film 90 on both side surfaces of the sacrificial film 140 is separated to ferroelectric films 90a and 90b (refer to FIG. 2C). In the etching back, since the alumina film 80c is deposited in the upper part of the second interlevel insulator 80, the alumina film 80c on the bottom surface of the groove 150b can be used as an RIE etching stopper.

Figure 2D:
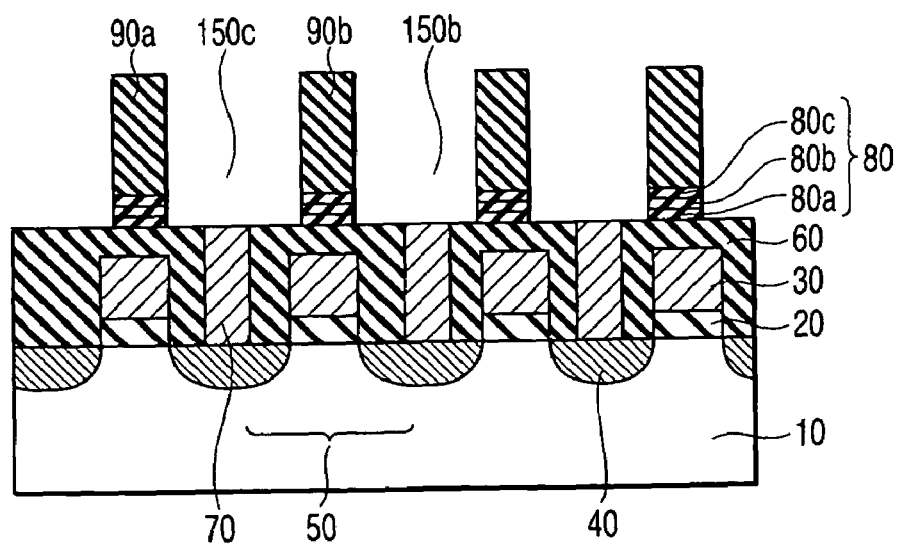

(5) Next, the sacrificial film 140 and the second interlevel insulator 80 under the sacrificial film 140 are removed by wet etching, which uses hydrofluoric acid (HF), ammonium fluoride ($NH_4F$), phosphoric acid ($H_3PO_4$) or the like, or chemical dry etching (CDE) or the like, and thus a groove 150c is formed. With this processing, the ferroelectric film 90 is made to completely separated vertical ferroelectric films 90a and 90b that are isolated from each other, as shown in FIG. 2D. Although the ferroelectric films 90a and 90b will be made to elements of adjacent capacitors and have a feature that the surfaces of them in contact with the sacrificial film 140 are different from each other in the characteristics, they are commonly referred as the ferroelectric film 90 hereinafter. Further, the second interlevel insulator 80 under the ferroelectric film 90 remains without being removed.

The ferroelectric film 90 may be crystallized by a heat treatment. As a heat treatment condition, an annealing temperature in an oxygen atmosphere is set to, for example, about 700° C. and an annealing time is set to about one hour. In the heat treatment, the alumina film 80c in the second interlevel insulator 80 under the ferroelectric film 90 has an effect of improving the crystallinity of the crystallized ferroelectric film.

The heat treatment may be carried out before the sacrificial film 140 is removed. In this case, another alumina film is preferably formed on the side surfaces of the sacrificial film 140 to improve the crystallinity of the ferroelectric film.

Figure 2E:
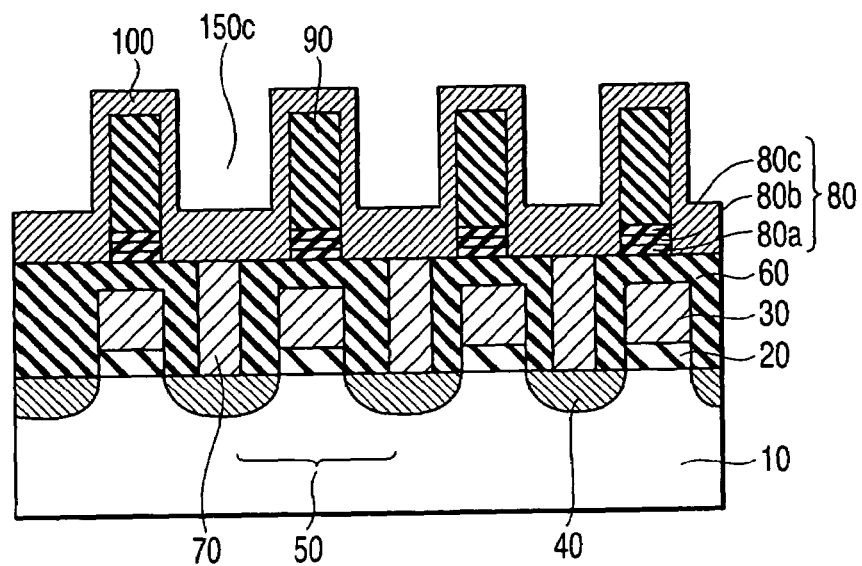

(6) As shown in FIG. 2E, a capacitor electrode film 100 is deposited to cover entire surfaces of the groove 150c and the ferroelectric film 90. The electrode film 100 is connected to the contact plug 70 on the bottom of the groove 150c. Although a method of forming the electrode film 100 that is capable to deposit the electrode film 100 on the side surfaces and the bottom of the groove 150c with a good coverage, such as MOCVD or the like, is preferably used, other methods may be used. The thickness of the electrode film 100 may be allowed if it is uneven at the upper end and the lower end of the side surface.

The electrode distance can be made smaller than the gate length of the transistor 50 by forming the ferroelectric film 90 and the electrode 100 as described above. That is, the distance can be smaller than the minimum feature size of the lithography technology being used.

Next, the electrode of the ferroelectric capacitor connected to the same word line disposed in a front to rear direction of the paper sheet is separated by lithography and etching, for example, by RIE.

Figure 2F:
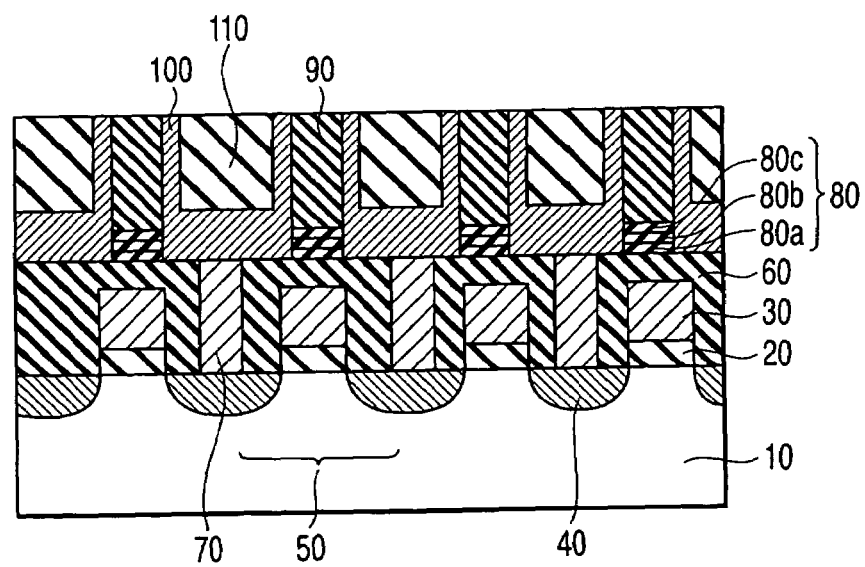

(7) Next, a third interlevel insulator 110 is deposited to fill the groove 150c between the electrode films 100 and then planarized by CMP. Further, as shown in FIG. 2F, CMP is carried out until the electrode film 100 on the ferroelectric film 90 is removed to separate the electrode film 100. The CMP processes for planarizing the third interlevel insulator 110 and for removing the electrode film 100 on the ferroelectric film 90 may be continuously carried out.

Next, a fourth interlevel insulator 120 is deposited on an entire surface of the device, and the surface thereof is planarized by, for example, CMP. A conductive material 130 is further deposited on the fourth interlevel insulator 120 and patterned so that a bit line 130 is formed (refer to FIG. 1). Thereafter, the chain type ferroelectric memory device including the vertical ferroelectric capacitor of the embodiment is completed through a process for connecting one end of the chain to the bit line 130 through a block selection transistor (not shown), a process for connecting the opposite end of the chain to a plate line (not shown), and further processes for forming components necessary to the semiconductor device such as multi-level wiring and the like.

According to the embodiment, it can be determined the distance between the facing electrodes of the ferroelectric capacitor independent of resolution limit of the lithography technology being used, which is different from a conventional vertical ferroelectric memory device. In other words, the electrode distance can be controlled by the width of the ferroelectric film 90 in the horizontal direction, that is, by the thickness of the ferroelectric film 90 on the side surface of the sacrificial film. Accordingly, it can be controlled the electrode distance of the ferroelectric capacitor, that is, the capacitance of the ferroelectric capacitor, without being limited by the minimum feature size of the lithography being used. As a result, electrode distance smaller than the gate length of the transistor of the memory cell, that is, smaller than the minimum feature size of the lithography technology can be realized. The ferroelectric capacitor can be miniaturized as described above. It can be further reduced the drive voltage of the ferroelectric memory device by miniaturizing the electrode distance of the ferroelectric capacitor. Further, since the electrode distance of the ferroelectric capacitor can be very easily controlled, it can be suppressed variation of capacitor characteristics.

As described above, according to the embodiment, it can be provided the ferroelectric memory device, which includes the vertical ferroelectric capacitor having the electrode distance smaller than the minimum feature size of the lithography technology being used and suitable for the miniaturization, and the method of manufacturing the same.

Second Embodiment

In the first embodiment, the ferroelectric film 90 is formed on the side surfaces of the groove 150a formed in the sacrificial film 140. In the second embodiment of the present invention, however, a ferroelectric film is deposited in a groove formed by removing a second sacrificial disposed film between first and third sacrificial films. Accordingly, the embodiment provides a ferroelectric memory device comprising a vertical ferroelectric capacitor having an electrode distance smaller than a minimum feature size of a lithography technology being used, and which is suitable for miniaturization, and a method of manufacturing the same.

FIG. 1, which is used in the first embodiment, also shows a cross sectional structure of a ferroelectric memory device in a bit line direction according to the second embodiment. Accordingly, the detailed explanation of the structure of the ferroelectric memory device according to the second embodiment is omitted.

The ferroelectric memory device according to the second embodiment includes a transistor 50 formed on a semiconductor substrate 10 and a vertical ferroelectric capacitor formed above the transistor 50. The transistor 50 is electrically connected in parallel to the ferroelectric capacitor, and one set of the transistor 50 and the ferroelectric capacitor connected in parallel constitutes a single memory cell. Further, a plurality of memory cells are connected in series to each other and constitute a chain structure, one end of the chain is connected to a bit line 130 through a block selection transistor (not shown), and the other end of the chain is connected to a plate line (not shown).

A pair of electrodes 100 of the ferroelectric capacitor are disposed in a channel length direction of the transistor 50 facing each other and put a ferroelectric film 90 in-between. An electrode distance is smaller than a gate length of the transistor 50. The gate length is patterned to a minimum feature size of a lithography technology being used.

Figure 3A:
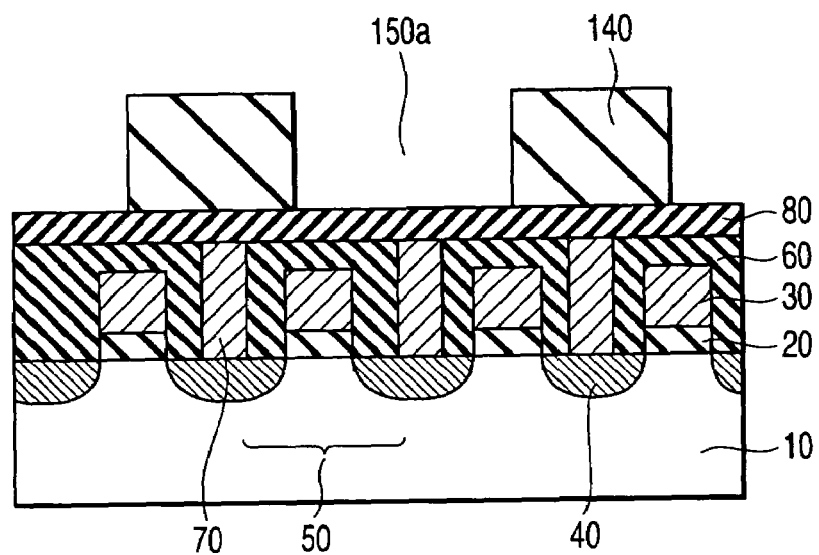
FIGS. 3A to 3K are process sectional views shown to explain an example of manufacturing process of a ferroelectric memory device according to a second embodiment of the present invention.

An example of a method of manufacturing the ferroelectric memory device of the second embodiment will be explained using process sectional views of FIGS. 3A to 3K in a chain direction of the ferroelectric memory device. Since processes until a groove 150a is formed by patterning a first sacrificial film 140 deposited above the transistor 50 shown in FIG. 3A is the same as the processes (1) to (3) of the first embodiment, the explanation of the processes is omitted. Although a case in which an alumina film 80c is not formed in a second interlevel insulator 80 is explained in the second embodiment, the alumina film 80c may be formed.

Figure 3B:
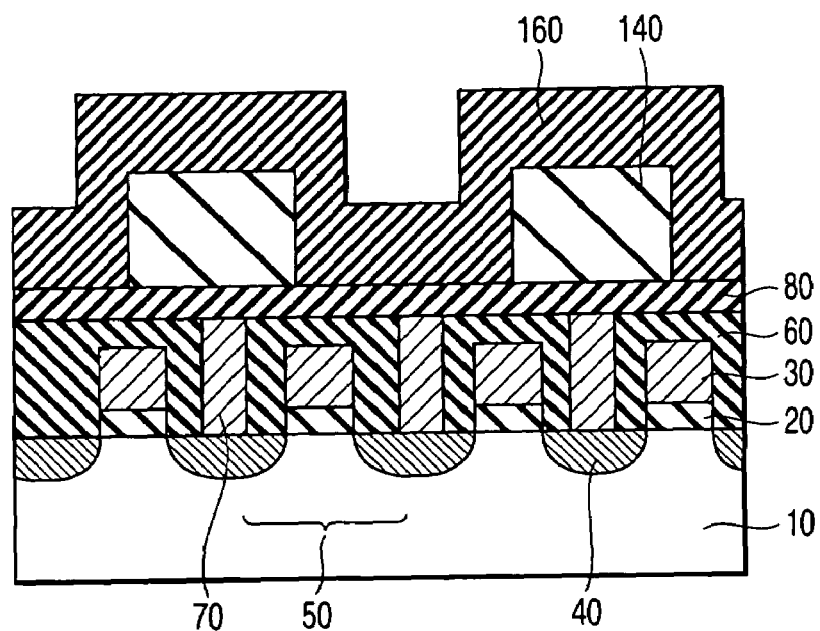

(4) Next, as shown in FIG. 3B, a second sacrificial film 160 composed of, for example, a silicon nitride film is deposited on entire surfaces of the first sacrificial film 140 and the groove 150a. The second sacrificial film 160 can be a film other than the silicon nitride film as long as it can be selectively etched with respect to the first sacrificial film 140. MOCVD or the like, for example, may be used to deposit the second sacrificial film 160 to improve the coverage on the side surfaces of the first sacrificial film 140. Although it is preferable to deposit the second sacrificial film 160 on the side surfaces of the first sacrificial film 140 in a uniform thickness, the second sacrificial film 160 may have uneven thickness in the upper portion and the lower portion thereof. Further, the second sacrificial film 160 may be deposited thick near the corner portions of the first sacrificial film 140. A thickness of the second sacrificial film 160 in the horizontal direction deposited on the side surfaces of the first sacrificial film 140 corresponds to a thickness of a ferroelectric film of a ferroelectric capacitor to be formed later, that is, corresponds to an electrode distance of the capacitor.

Figure 3C:
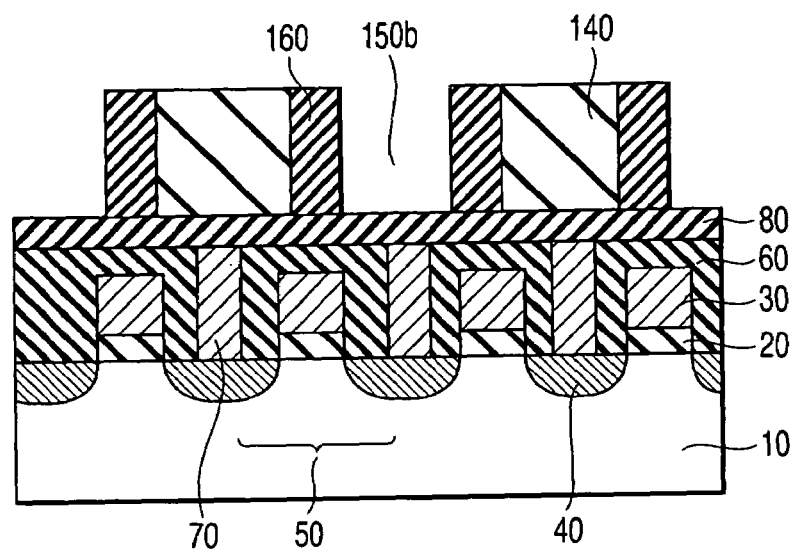

Next, as shown in FIG. 3C, the second sacrificial film 160 deposited on the horizontal surface is removed by etching back an entire surface thereof by, for example, RIE, and a groove 150b is formed, and thus separated second sacrificial films 160 are formed on both side surfaces of the first sacrificial film 140. In the etching back, if an alumina film is included in the top of the second interlevel insulator 80, the alumina film on the bottom of the groove 150b can be used as an RIE etching stopper.

Figure 3D:
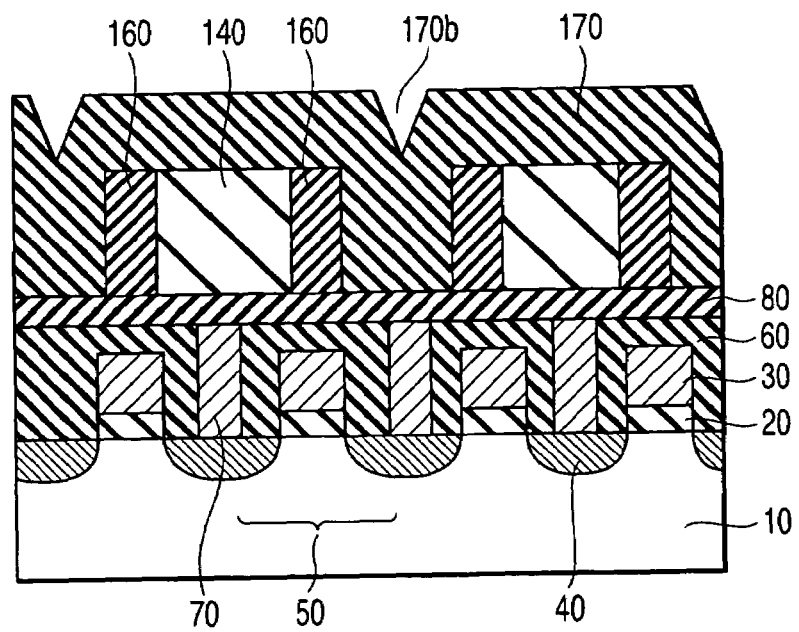

(5) Next, as shown in FIG. 3D, a third sacrificial film 170 composed of, for example, a silicon oxide film is deposited on entire surfaces of the first sacrificial film 140 and the second sacrificial film 160 and inside of the groove 150b so that the groove 150b is completely filled with the third sacrificial film 170. In the deposition of the third sacrificial film 170, a void and/or a concave-shaped recess 170b, which is not perfectly filled with the third sacrificial film 170, may be formed on the groove 150b. However, as long as the third sacrificial film 170 has a sufficient thickness and the bottom of the void and/or recess 170b does not reach to a level of the upper surfaces of the first sacrificial film 140 and the second sacrificial film 160 as shown in FIG. 3D, this is substantially not a problem because the third sacrificial film 170 is planarized and removed to that level in a next CMP process.

Next, the third sacrificial film 170 is planarized to the level of the upper surfaces of the first sacrificial film 140 and the second sacrificial film 160 (refer to FIG. 3E).

(6) Next, wet etching or CDE is carried out to remove the second sacrificial film 160. If a silicon nitride film is used as the second sacrificial film 160, hot phosphoric acid or the like, for example, can be used to etching. With this processing, the first sacrificial film 140 and the third sacrificial film 170 alternately remain on the second interlevel insulator 80 and thus a groove 150c is formed between the first and third sacrificial films 140, 170 as shown in FIG. 3F.

Figure 3G:
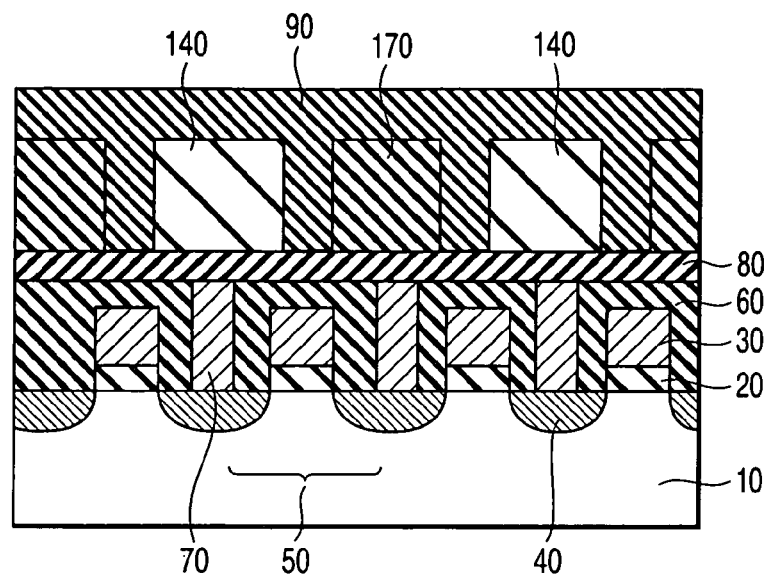

(7) Next, as shown in FIG. 3G, a ferroelectric film 90 is deposited to completely fill the groove 150c. MOCVD, for example, can be used as a method of depositing the ferroelectric film 90. Further, before forming the ferroelectric film 90, if a material such as a thin alumina film or the like is deposited on the surfaces of the first sacrificial film 140 and the third sacrificial film 170, then there can be expected an effect of suppressing reaction of the ferroelectric film with the sacrificial films during the deposition of the ferroelectric film. Further, if the thin alumina film is formed, then it is also expected to improve crystallinity when the ferroelectric film is crystallized.

Figure 3H:
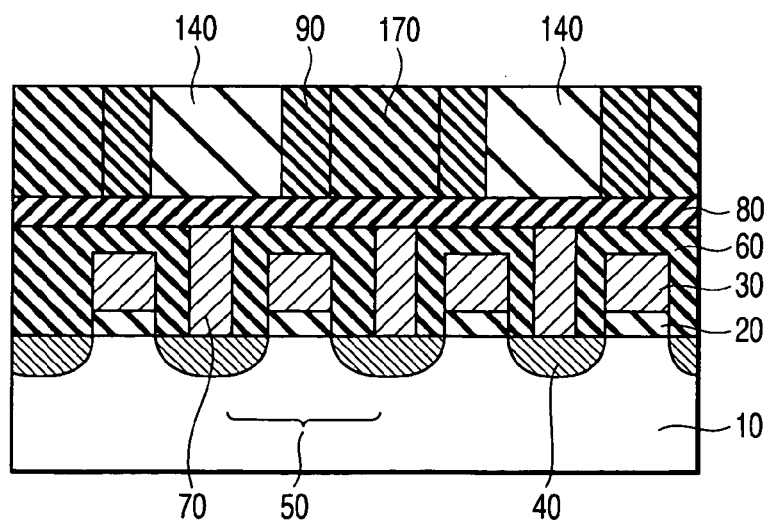
Figure 3:
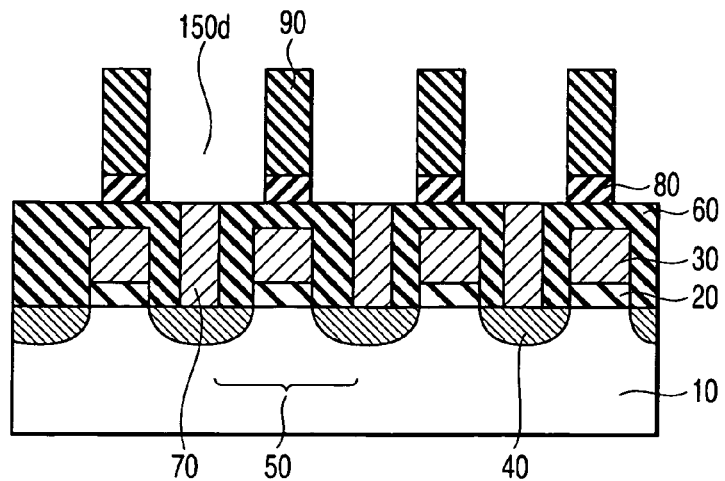
Figure 3:
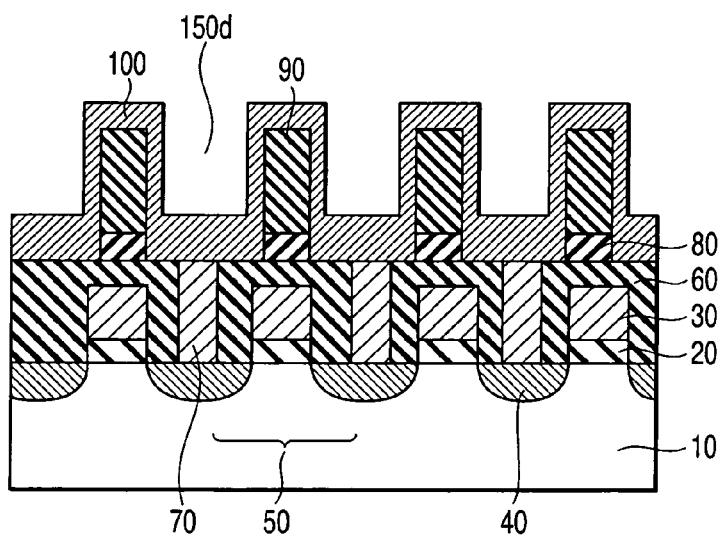
Figure 3:
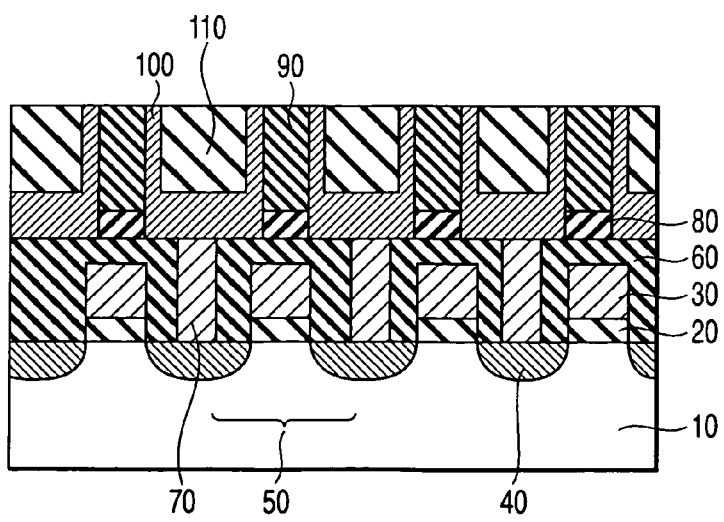

Next, as shown in FIG. 3H, the surface of the ferroelectric film 90 is removed by CMP, and the ferroelectric film 90 is recessed to as high as the first sacrificial film 140 and the third sacrificial film 170.

The ferroelectric film 90 may be crystallized by a heat treatment. As a heat treatment condition, an annealing temperature in oxygen atmosphere is set to, for example, about 700° C. and an annealing time is set to about one hour.

(8) Next, the first sacrificial film 140 and the third sacrificial film 170 are removed by etching to form a groove 150d. With this processing, the respective ferroelectric films 90 are isolated. Further, the second interlevel insulator 80 under the first sacrificial film 140 and the third sacrificial film 170 is also removed, thereby exposing the surface of contact plug 70 as shown in FIG. 3I.

(9) Since subsequent processes are the same as the process (6) and the subsequent processes of the first embodiment, they will be explained briefly.

As shown in FIG. 3J, an electrode film 100 of a capacitor is deposited on entire surfaces of the ferroelectric film 90 and the groove 150d. The electrode film 100 is connected to the contact plug 70 on the bottom of the groove 150d. Next, the electrode of the ferroelectric capacitor on the same word line disposed in a front to rear direction of the paper sheet is separated by lithography and etching, for example, by RIE.

Next, after a third interlevel insulator 110 is deposited in the groove 150d between the electrode films 100 and thus the groove 150d is completely filled with the third interlevel insulator 110, the third interlevel insulator 110 and the electrode films 100 are recessed until the upper level of the ferroelectric film 90 by, for example, CMP so that the electrode 100 are separated as shown in FIG. 3K.

Accordingly, the electrode distance can be made smaller than the gate length of the transistor 50 by forming the ferroelectric film 90 and the electrode 100 as described above. That is, the distance can be smaller than the minimum feature size of the lithography technology being used.

Next, a fourth interlevel insulator 120 is deposited on an entire surface of the device, and the surface of the fourth interlevel insulator 120 is planarized by CMP. Further, a conductive material 130 is deposited on an entire surface of the fourth interlevel insulator 120 and a bit line 130 is formed by patterning the conductive material 130 (refer to FIG. 1). Thereafter, the chain type ferroelectric memory device including the vertical ferroelectric capacitor according to the embodiment is completed through a process for connecting the bit line 130 to one end of the chain through a block selection transistor (not shown) and connecting the opposite end of the chain to a plate line (not shown).

According to the second embodiment, in addition to the effects of the first embodiment, the following effects can be also expected. That is, since the ferroelectric film in the first embodiment is deposited on the side surfaces of the sacrificial film 140, only one side of the ferroelectric film is formed in contact with the sacrificial film 140. Thus, there is a possibility to have different crystallinity in the ferroelectric film between a surface in contact with the sacrificial film 140 and the other surface not in contact with the sacrificial film 140 when the ferroelectric film is crystallized. Accordingly, the ferroelectric capacitor likely has asymmetric electric characteristics depending on polarity of applied voltage. In contrast with the first embodiment, in the second embodiment, both surfaces of the ferroelectric film 90 can be crystallized under substantially the same condition by sandwiching it between the second sacrificial film 140 and the third sacrificial film 170 when it is crystallized, and thus there is a less possibility of occurrence of the polarity dependence in the electric characteristics as described above.

As described above, the embodiment provides a ferroelectric memory device comprising a vertical ferroelectric capacitor having an electrode distance smaller than a minimum feature size of a lithography technology being used, and which is suitable for miniaturization, and a method of manufacturing the same.

Third Embodiment

In the first and second embodiments, the ferroelectric film is formed in the vertical and isolated shape, and the electrode is deposited to cover the isolated ferroelectric film. According to third embodiment of the present invention, it is provided a ferroelectric memory device, which includes a vertical ferroelectric capacitor having an electrode distance smaller than a minimum feature size of a lithography technology being used by depositing electrodes first putting a thinly formed sacrificial film in-between, thereafter removing the thin sacrificial film to form a groove and then depositing a ferroelectric film in the groove, and a method of manufacturing the same.

Figure 4:
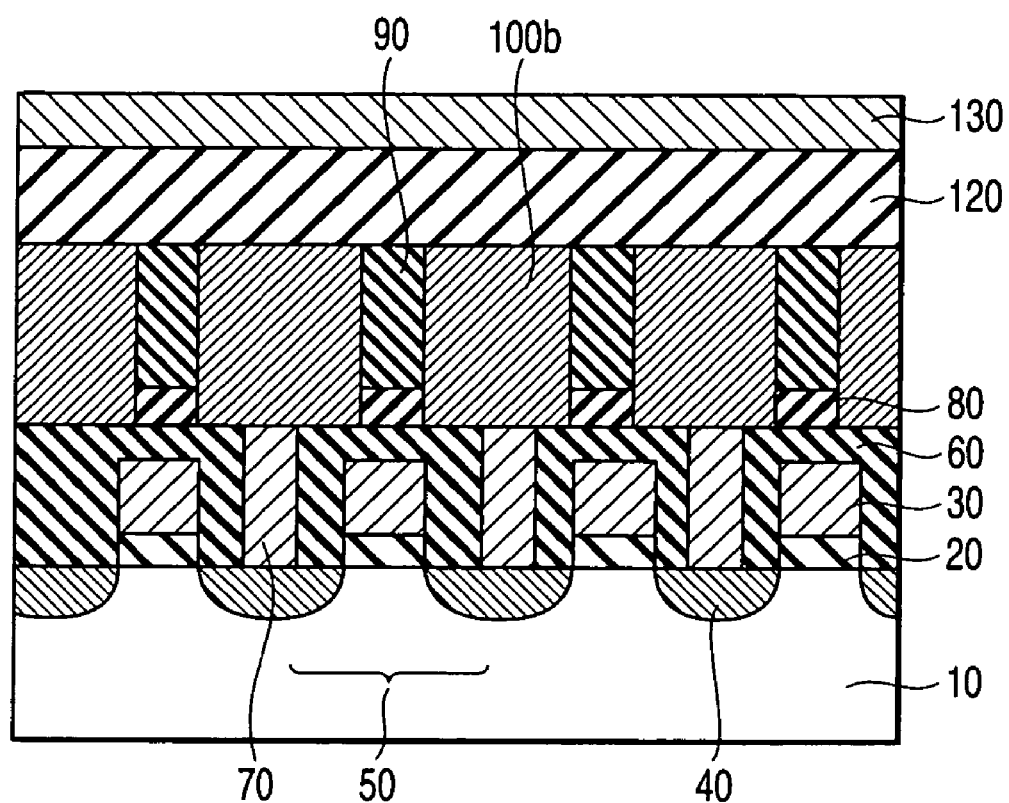
FIG. 4 is a sectional view shown to explain an example of a structure of a ferroelectric memory device according to a third embodiment of the present invention.

FIG. 4 shows an example of a sectional view in a chain direction of a ferroelectric memory device according to the third embodiment. The ferroelectric memory device according to the embodiment includes a transistor 50 formed on a semiconductor substrate 10 and a vertical ferroelectric capacitor formed above the transistor 50. The transistor 50 is electrically connected in parallel to the ferroelectric capacitor, and one set of the transistor 50 and the ferroelectric capacitor connected in parallel constitutes a single memory cell. The third embodiment is different from the first and second embodiments in that the space between the capacitors of adjacent memory cells is filled with a single electrode 100 and no interlevel insulator exists between the capacitors. It may also be made to exist an interlevel insulator between the capacitors.

A pair of electrodes 100 of the ferroelectric capacitor are disposed in a channel length direction of the transistor 50 facing each other and put a ferroelectric film 90 in-between. An electrode distance is smaller than a gate length of the transistor 50. The gate length is patterned to a minimum feature size of a lithography technology being used.

The third embodiment has a chain structure in which a plurality of memory cells are connected in series, and a diffusion layer at one end of a chain is connected to the bit line 130 through a block selection transistor (not shown). The opposite end of the chain is connected to a plate line (not shown).

Figure 5A:
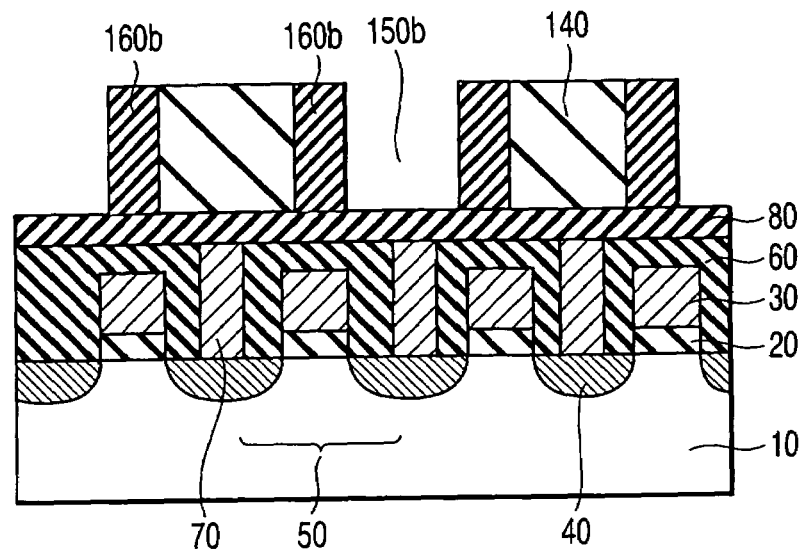

An example of the method of manufacturing the ferroelectric memory device of the third embodiment will be explained using process sectional views in the chain direction of the ferroelectric memory device shown in FIGS. 5A to 5K. The processes of the third embodiment up to the process until second sacrificial films 160b are remained on both side surfaces of a first sacrificial film 140 and a groove 150b is formed as shown in FIG. 5A are the same as the processes up to the process (4) of the second embodiment, the explanation of the processes is omitted. The second sacrificial film 160b is deposited to have a thinner film thickness than a minimum feature size of the lithography being used.

Figure 5B:
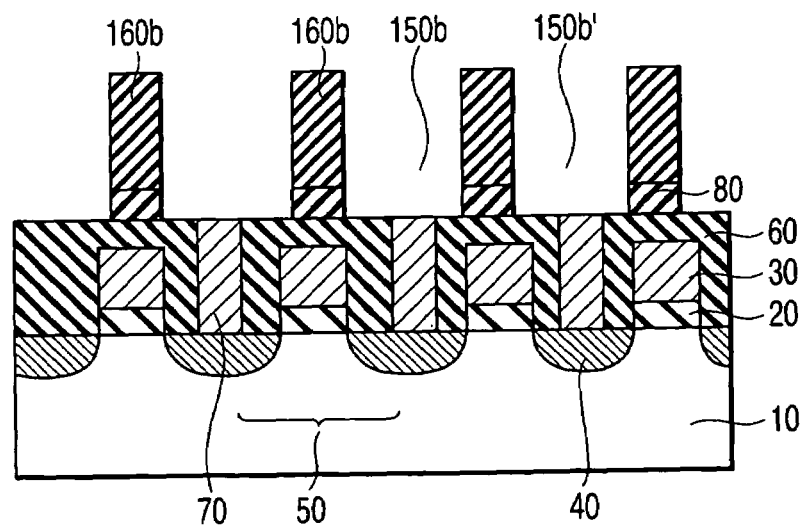

(5) Next, as shown in FIG. 5B, the first sacrificial film 140 is removed by CDE or wet etching, further a second interlevel insulator 80 under the first sacrificial film 140 is also removed to form a groove 150b', and thus a contact plug 70 located under the first sacrificial film 140 is exposed.

Figure 5C:
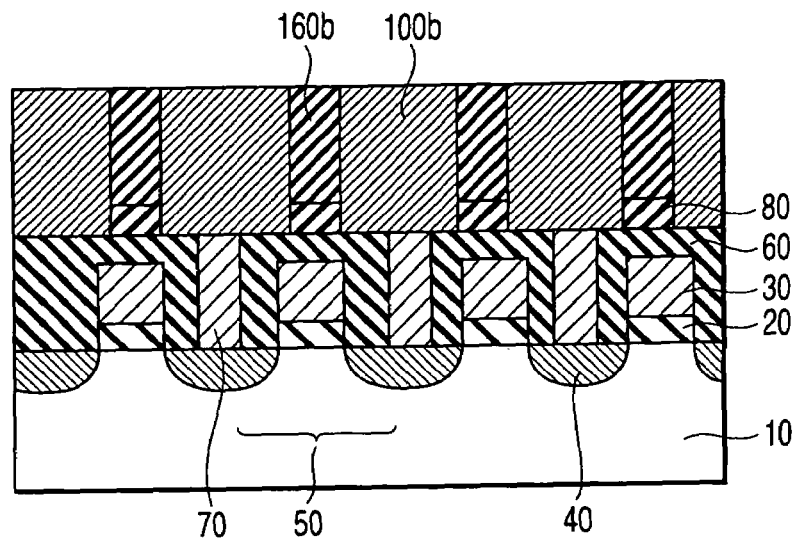
Figure 5D:
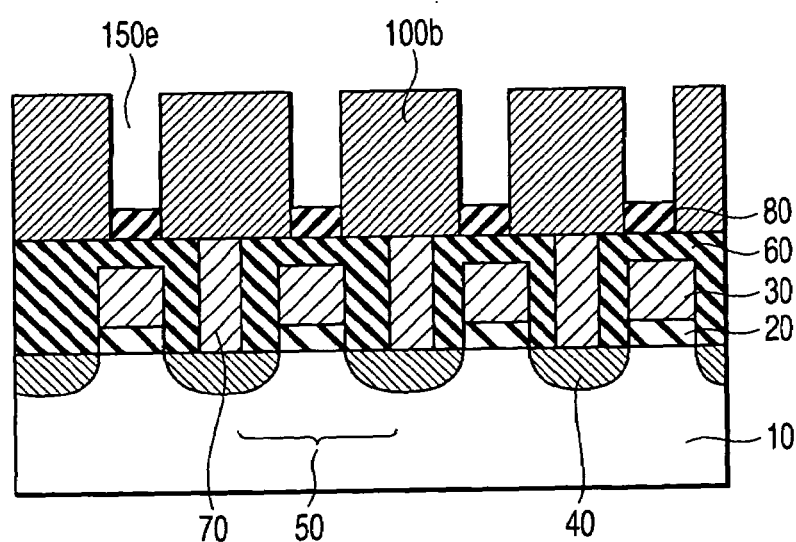

Next, as shown in FIG. 5C, an electrode material 100b is deposited thick so that the grooves 150b, 150b' are completely filled with it, and the surface of the electrode material 100b is planarized by CMP to isolate individual electrodes. MOCVD, for example, is used as a method of depositing the electrode material 100b. For example, Pt, Ir, SRO (SrRuO$_3$), LSCO ((LaSr)CoO$_3$), LaNiO$_3$, or the like can be used as the electrode material 100b. It is preferable that the electrode material does not react with a ferroelectric film to be deposited in a later process. Further, the electrode 100b is connected to the contact plug 70 on the bottoms of the grooves 150, 150b'.

(6) Next, the second sacrificial film 160b is removed using CDE or wet etching, thereby forming a groove 150e. In the etching, the second interlevel insulator 80 on the bottom of the groove 150e under the second sacrificial film 160b is remained without being removed (refer to FIG. 5D).

Next, a ferroelectric film 90 is deposited to completely fill the groove 150e (refer to FIG. 5E). MOCVD, for example, can be used as a method of depositing the ferroelectric film 90. Then, the surface of the ferroelectric film 90 is removed by CMP to a level of an upper surface of the electrode 100b.

Accordingly, the electrode distance can be made smaller than the gate length of the transistor 50 by forming the ferroelectric film 90 and the electrode 100 as described above. That is, the distance can be smaller than the minimum feature size of the lithography technology being used.

The ferroelectric film 90 may be crystallized by a heat treatment. As a heat treatment condition, an annealing temperature in an oxygen atmosphere is set to, for example, about 700° C. and an annealing time is set to about one hour.

(7) Next, the electrode of memory cells connected to the same word line in a front to rear direction of the paper sheet is separated by lithography and RIE.

A fourth interlevel insulator 120 is deposited on an entire surface of the device, and the surface thereof is planarized by CMP. A conductive material is further deposited on the fourth interlevel insulator 120 and patterned to form a bit line 130 (refer to FIG. 4). Thereafter, the chain type ferroelectric memory device is completed through a process for connecting one end of a chain to the bit line 130 through a block selection transistor (not shown) and connecting the opposite end of the chain to a plate line (not shown).

According to the third embodiment, the following effect can be also expected in addition to the effects of the first and second embodiments. That is, in the first and second embodiments, since the ferroelectric film is formed on the side surfaces of the sacrificial film(s), it needs to pay attention to prevent reaction between the sacrificial film and the ferroelectric film when the ferroelectric film is deposited. It is preferable to deposit a film, for example, an alumina film, which suppresses that reaction, on the sacrificial film. In contrast, in the third embodiment, the groove in which the ferroelectric film is to be deposited is formed in an electrode material, that is, any one of variety of conductive materials including, for example, Pt, Ir, Ru, La, or the like. Since these electrode materials are unlikely to react with the ferroelectric film even if the ferroelectric film is deposited directly thereon, and thus the manufacturing process can be simplified.

Note that if the grooves 150b and 150b' are imperfectly filled with the electrode material 100b in the process (5) of the third embodiment described above, a thin groove-shaped cavity 100x can be formed at the center of the groove 150b, and there is a possibility that a ferroelectric film 90x also fills the cavity 100x in the process of deposition of the ferroelectric film 90. In this case, a structure shown in FIG. 6 will be formed, the structure including a cavity 100x in the electrode 100b can be allowed because no adverse effect may be caused by the ferroelectric film filling a part of the electrode 100b. There is also a method of depositing the electrode 100b thick to prevent formation of the cavity 100x. However, if the method is not realistic in view of the throughput of the process, it can be left the thin groove-shaped cavity 100x at the center of the electrode and to fill it with the ferroelectric film 90x composed of PZT or the like.

As described above, the embodiment provides a ferroelectric memory device comprising a vertical ferroelectric capacitor having an electrode distance smaller than a minimum feature size of a lithography technology being used, and which is suitable for miniaturization, and a method of manufacturing the same.

The present invention is not limited to the above embodiments and can be embodied in various modifications. For example, the embodiments can be modified by changing the order of the manufacturing processes. An example thereof is shown in modification 1.

Modification 1

A modification 1 shows a modification of the third embodiment in which the process of forming the contact plug is carried out after the process of depositing the second interlevel insulator instead of before depositing the second interlevel insulator.

Figure 7:
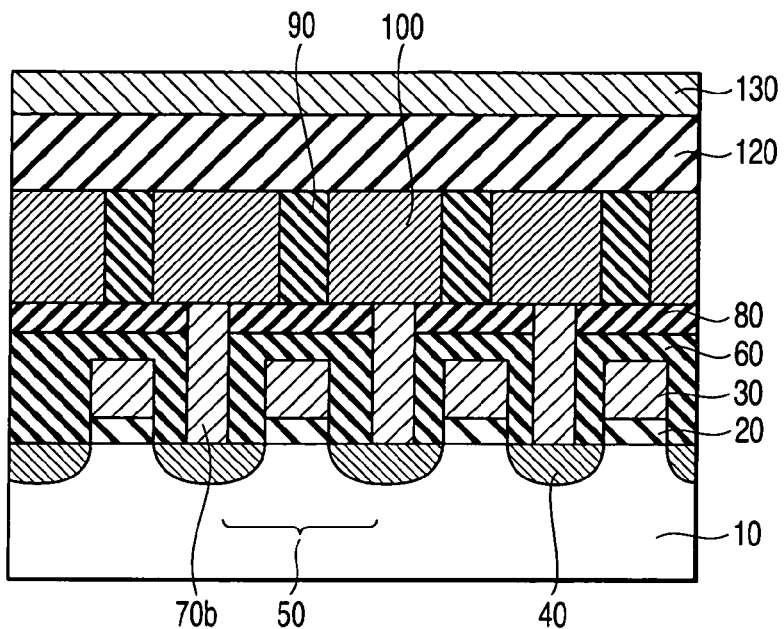
FIG. 7 is a sectional view shown to explain an example of a structure of a ferroelectric memory device according to a modification 1 of the present invention.

FIG. 7 shows an example of a sectional view of a ferroelectric memory device in a chain direction according to the modification 1.

In the modification 1, a contact plug 70b is formed in a first interlevel insulator 60 and a second interlevel insulator 80 that are formed over a transistor 50. Accordingly, the second interlevel insulator 80 is removed only in the portion of the contact plug 70b and left under an electrode 100 other than the contact plug 70b.

A method of manufacturing the ferroelectric memory device of the modification will be explained referring to a process sectional view of FIG. 8 in the chain direction of the ferroelectric memory device.

Since the process until a transistor 50 is formed on a semiconductor substrate 10 and a first interlevel insulator 60 is formed over the transistor 50 is the same as the process (1) of the first embodiment, the explanation of the process is omitted.

Figure 8:
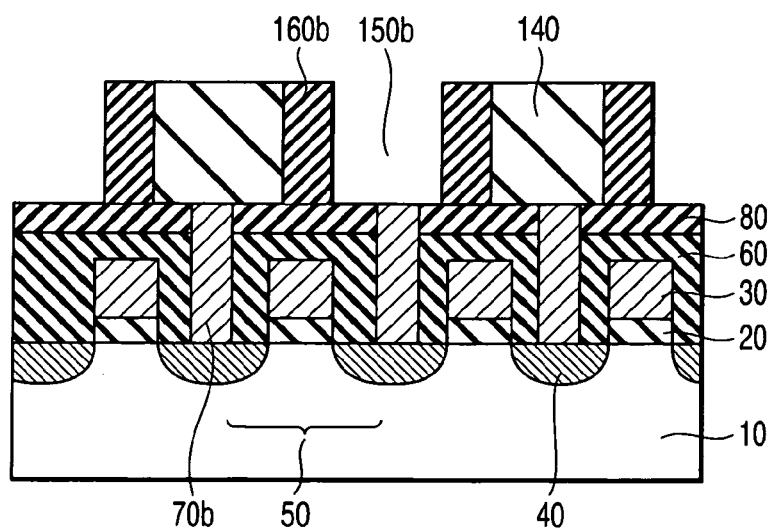
FIG. 8 is a process sectional view shown to explain an example of a manufacturing process of the ferroelectric memory device according to the modification 1.

Next, referring to FIG. 8, a second interlevel insulator 80 is deposited on an entire surface of the first interlevel insulator 60. A thin alumina film may be included in the top of the second interlevel insulator 80. Next, a contact hole is formed by patterning the first and second interlevel insulators 60 and 80 by lithography and etching, and a conductive material is deposited by CVD or the like to fill the contact hole. A surface of the conductive material is planarized, thereby forming the contact plug 70b. With the above patterning, the second interlevel insulator 80 can be left in the portion other than on the contact plug 70b.

Since processes for forming a ferroelectric capacitor above the transistor 50 and the like after the process of depositing a first sacrificial film 140 are the same as those in the third embodiment, the explanation of the processes is omitted.

According to the modification 1, the following effect can be further expected in addition to the effects of the first, second, and third embodiments. That is, there is an effect of improving the controllability of the crystal orientation of a ferroelectric film 90 by leaving the second interlevel insulator 80 in the portion other than the contact plug 70b.

It should be noted that the present invention is not limited to the above embodiments and can be variously modified. For example, the electrode material may be any one of metal material such as Ru or the like, or the electrode may be formed of conductive oxides such as $IrO_2$, $RuO_2$, or the like. Although the respective embodiments explain the chain type ferroelectric memory device, the present invention can also be applied to a conventional ferroelectric memory device that is not a chain type. Further, any of the chain and conventional type ferroelectric memory devices can be applied to a ferroelectric memory device having 1 transistor/1 capacitor (1T1C) structure, 2 transistors/2 capacitors (2T2C) structure (system described in ISSCC 1998, p. 130, etc.) or 1 transistor/2 capacitors (1T2C) structure. Further, it can be also applied to various types of a three-dimensional stack structure.

As described above, the present invention provides a ferroelectric memory device comprising a vertical ferroelectric capacitor having an electrode distance smaller than a minimum feature size of a lithography technology being used, and which is suitable for miniaturization, and a method of manufacturing the same. The electrode distance is determined by a film thickness so that it does not depend on resolution limit of the lithography technology.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A ferroelectric memory device comprising:
an MIS transistor formed on a substrate; and
a ferroelectric capacitor formed on an interlevel insulator above the MIS transistor, and including a first electrode and a second electrode separated by a ferroelectric film in-between, wherein the first and second electrodes are vertically disposed to face each other in a channel length direction of the MIS transistor and each consists of a single part;
wherein the transistor and the ferroelectric capacitor are electrically connected in parallel to each other and constitute a single memory cell, the first electrode of the ferroelectric capacitor is connected with one source/drain of the MIS transistor by a first contact plug alone, the second electrode is connected with the other source/drain of the MIS transistor by a second contact plug alone, and the first and second contact plugs have the same dimension,
wherein a distance between the first and second electrodes of the ferroelectric capacitor is smaller than a gate length of the MIS transistor.

2. The ferroelectric memory device according to claim 1, wherein the distance between the first and second electrodes of the ferroelectric capacitor is smaller than a minimum feature size of lithography being used.

3. The ferroelectric memory device according to claim 2, wherein the each electrode of the ferroelectric capacitor contains at least one of platinum, iridium, ruthenium, and titanium.

4. The ferroelectric memory device according to claim 1, wherein a plurality of memory cells are electrically connected in series to each other.

5. The ferroelectric memory device according to claim 2, wherein the ferroelectric film includes a metal oxide having a perovskite structure, such as PZT ($Pb(Zr_xTi_{1-x}O_3)$), SBT ($SrBi_2Ta_2O_9$), BLT (($BiLa)_4Ti_3O_{12}$), or the like, or a ferroelectric material containing at least one of strontium, barium, calcium, lanthanum, niobium, tungsten, magnesium, cobalt, iron, nickel, and manganese.

\* \* \* \* \*